United States Patent
Cheong

(10) Patent No.: US 10,822,712 B2
(45) Date of Patent: Nov. 3, 2020

(54) ELECTROPLATING APPARATUS

(71) Applicant: ELECTRONICS AND TELECOMMUNICATIONS RESEARCH INSTITUTE, Daejeon (KR)

(72) Inventor: Woo-Seok Cheong, Daejeon (KR)

(73) Assignee: ELECTRONICS AND TELECOMMUNICATIONS RESEARCH INSTITUTE, Daejeon (KR)

( * ) Notice: Subject to any disclaimer, the term of this patent is extended or adjusted under 35 U.S.C. 154(b) by 51 days.

(21) Appl. No.: 15/695,934

(22) Filed: Sep. 5, 2017

(65) Prior Publication Data

US 2018/0087174 A1 Mar. 29, 2018

(30) Foreign Application Priority Data

Sep. 28, 2016 (KR) .................. 10-2016-0124661

(51) Int. Cl.
*C25D 7/12* (2006.01)
*C25D 5/02* (2006.01)
(Continued)

(52) U.S. Cl.
CPC ............ *C25D 7/123* (2013.01); *C25D 5/022* (2013.01); *C25D 5/16* (2013.01); *C25D 5/18* (2013.01); *C25D 17/001* (2013.01); *C25D 17/004* (2013.01); *C25D 17/12* (2013.01); *C25D 21/10* (2013.01); *H01L 21/76829* (2013.01); *H01L 21/76873* (2013.01); *C25D 3/38* (2013.01); *C25D 17/06* (2013.01)

(58) Field of Classification Search
CPC .......... C25D 7/123; C25D 7/12; C25D 7/001; C25D 7/004; C25D 7/06; C25D 5/022; C25D 5/16; C25D 5/18; C25D 21/10; C25D 3/38; H01L 21/76829; H01L 21/76873
See application file for complete search history.

(56) References Cited

U.S. PATENT DOCUMENTS 5,847,918 A * 12/1998 Shufflebotham .... H01L 21/6833
361/234
6,423,636 B1 * 7/2002 Dordi ................. H01L 21/2885
257/E21.175
(Continued)

FOREIGN PATENT DOCUMENTS

JP 2010-211647 A 9/2010
JP 2010-211823 A 9/2010
(Continued)

*Primary Examiner* — Louis J Rufo

(57) ABSTRACT

An electroplating apparatus includes a substrate, a seed layer provided on a top surface of the substrate, a high-voltage portion provided on a bottom surface of the substrate, a housing sealing the high-voltage portion, an anode structure spaced apart from the seed layer in a direction perpendicular to the top surface of the substrate, first power source generating a first voltage difference between the seed layer and the anode structure, and a second power source applying a second voltage to the high-voltage portion. A positive terminal of the first power source is electrically connected to the anode structure, and a negative terminal of the first power source is electrically connected to the seed layer.

7 Claims, 7 Drawing Sheets

(51) Int. Cl.
  *C25D 21/10* (2006.01)
  *C25D 17/00* (2006.01)
  *C25D 17/12* (2006.01)
  *C25D 5/16* (2006.01)
  *C25D 5/18* (2006.01)
  *H01L 21/768* (2006.01)
  *C25D 17/06* (2006.01)
  *C25D 3/38* (2006.01)

(56) References Cited

U.S. PATENT DOCUMENTS

| | | |
|---|---|---|
| 6,447,908 B2 | 9/2002 | Yun et al. |
| 7,332,062 B1* | 2/2008 | Reder .................... C25D 17/06 204/230.6 |
| 8,605,038 B2 | 12/2013 | Cho |
| 8,605,055 B2 | 12/2013 | Han |
| 8,633,903 B2 | 1/2014 | Kim et al. |
| 2004/0045813 A1* | 3/2004 | Kanno .................... C25D 5/18 204/242 |
| 2006/0108231 A1* | 5/2006 | Weichart ................ C25D 17/06 205/165 |
| 2007/0072419 A1 | 3/2007 | Ju et al. |
| 2008/0128019 A1* | 6/2008 | Lopatin ................... C25D 5/022 136/252 |
| 2010/0231542 A1 | 9/2010 | Momose |
| 2012/0043301 A1* | 2/2012 | Arvin .................... C25D 17/007 216/86 |
| 2015/0376808 A1* | 12/2015 | Arvin ....................... C25D 3/56 205/254 |
| 2016/0326663 A1* | 11/2016 | Iwatsu ................... C25D 17/10 |

FOREIGN PATENT DOCUMENTS

| | | |
|---|---|---|
| JP | 2010-257492 A | 11/2010 |
| KR | 10-2008-0054318 A | 6/2008 |
| KR | 10-2009-0059726 A | 6/2009 |
| KR | 10-2010-0051292 A | 5/2010 |
| KR | 10-2010-0065486 A | 6/2010 |
| KR | 10-2010-0073546 A | 7/2010 |
| KR | 10-2010-0082514 A | 7/2010 |
| KR | 10-2010-0095886 A | 9/2010 |
| KR | 10-2010-0131076 A | 12/2010 |
| KR | 10-2011-0000722 A | 1/2011 |
| KR | 10-2011-0000985 A | 1/2011 |
| WO | WO 2008/072900 A1 | 6/2008 |

* cited by examiner

ELECTROPLATING APPARATUS

CROSS-REFERENCE TO RELATED APPLICATIONS

This U.S. non-provisional patent application claims priority under 35 U.S.C. § 119 of Korean Patent Application No. 10-2016-0124661, filed on Sep. 28, 2016, in the Korean Intellectual Property Office, the disclosure of which is hereby incorporated by reference in its entirety.

BACKGROUND

Embodiments of the inventive concepts relate to an electroplating apparatus and, more particularly, to an electroplating apparatus to form an electroplating layer with a uniform thickness.

Transparent electrodes may include a transparent conductive oxide, such as ITO (indium-tin oxide). The ITO has light transmittance of 85% or higher and sheet resistance of about 100 Ω/sq. The transparent electrodes for a next-generation touch sensor may require light transmittance of 90% or higher and sheet resistance of 10 Ω/sq or less. The transparent electrodes for the next-generation transparent heater may require light transmittance of 90% or higher and sheet resistance of 1 Ω/sq or less. In the technical field using the transparent electrodes, the transparent electrodes including a mesh-type metal layer may provide competitive optical and/or electrical characteristics. The transparent electrodes may be formed by an electro-less plating method, a printing method, a self-patterning method, a photo lithography method, and the like.

SUMMARY

Embodiments of the inventive concepts may provide an electroplating apparatus, which is capable of uniformizing an electron concentration in a seed layer.

Embodiments of the inventive concepts may provide an electroplating apparatus, which is capable of uniformizing an electron concentration in a seed pattern.

The purpose of embodiments of the inventive concepts, however, may not be limited to the above disclosure.

In an aspect, an electroplating apparatus may include a substrate, a seed layer provided on a top surface of the substrate, a high-voltage portion provided on a bottom surface of the substrate, a housing sealing the high-voltage portion, an anode structure spaced apart from the seed layer in a direction perpendicular to the top surface of the substrate, first power source generating a first voltage difference between the seed layer and the anode structure, and a second power source applying a second voltage to the high-voltage portion. A positive terminal of the first power source may be electrically connected to the anode structure, and a negative terminal of the first power source may be electrically connected to the seed layer.

In an aspect, the second power source may apply the second voltage ranging from about 1 kV to about 100 kV to the high-voltage portion.

In an aspect, the seed layer may overlap with the high-voltage portion in the direction perpendicular to the top surface of the substrate.

In an aspect, a top surface of the high-voltage portion may be immediately adjacent to the substrate, and a bottom surface of the seed layer may be immediately adjacent to the substrate. An area of the top surface of the high-voltage portion may be the same as or smaller than that of the bottom surface of the seed layer.

In an aspect, a top surface of the high-voltage portion may be immediately adjacent to the substrate, a bottom surface of the high-voltage portion may be opposite to and parallel to the top surface thereof, and side surfaces of the high-voltage portion may connect the top surface thereof with the bottom surface thereof. The housing may cover the bottom surface and the side surfaces, of the high-voltage portion.

In an aspect, the housing may surround the substrate.

In an aspect, portions of a surface of the substrate may contact with the high-voltage portion and the seed layer, and remain portions of the surface of the substrate may be covered with the housing.

In an aspect, a bottom surface of the seed layer may be immediately adjacent to the substrate, a top surface of the seed layer may be opposite to and parallel to the bottom surface thereof, and side surfaces of the seed layer may connect the top surface thereof with the bottom surface thereof. The housing may extend onto the side surfaces of the seed layer and expose the top surface of the seed layer.

In an aspect, the electroplating apparatus may further include a capping pattern provided on the seed layer. The capping pattern may include an opening penetrating therethrough, and a minimum distance between inner side surfaces of the opening may range from about 1 μm to about 20 μm.

In an aspect, the electroplating apparatus may further include a vessel for electroplating, and an electrolyte provided in the vessel. The seed layer and the anode structure may be dipped in the electrolyte.

In an aspect, the electroplating apparatus may further include a circulator provided in the vessel to circulate the electrolyte.

In an aspect, the anode structure may have a plate shape extending lengthwise along a direction perpendicular to a bottom surface of the vessel, and the seed layer may be disposed to face with and parallel to the anode structure.

In an aspect, the seed layer may include a seed pattern, and a minimum width of the seed pattern in a direction parallel to the top surface of the substrate may range from about 1 μm to about 20 μm.

In an aspect, a thickness of the seed pattern in the direction perpendicular to the top surface of the substrate may be about 20 nm or less.

BRIEF DESCRIPTION OF THE DRAWINGS

The inventive concepts will become more apparent in view of the attached drawings and accompanying detailed description.

DETAILED DESCRIPTION

Figure 1:
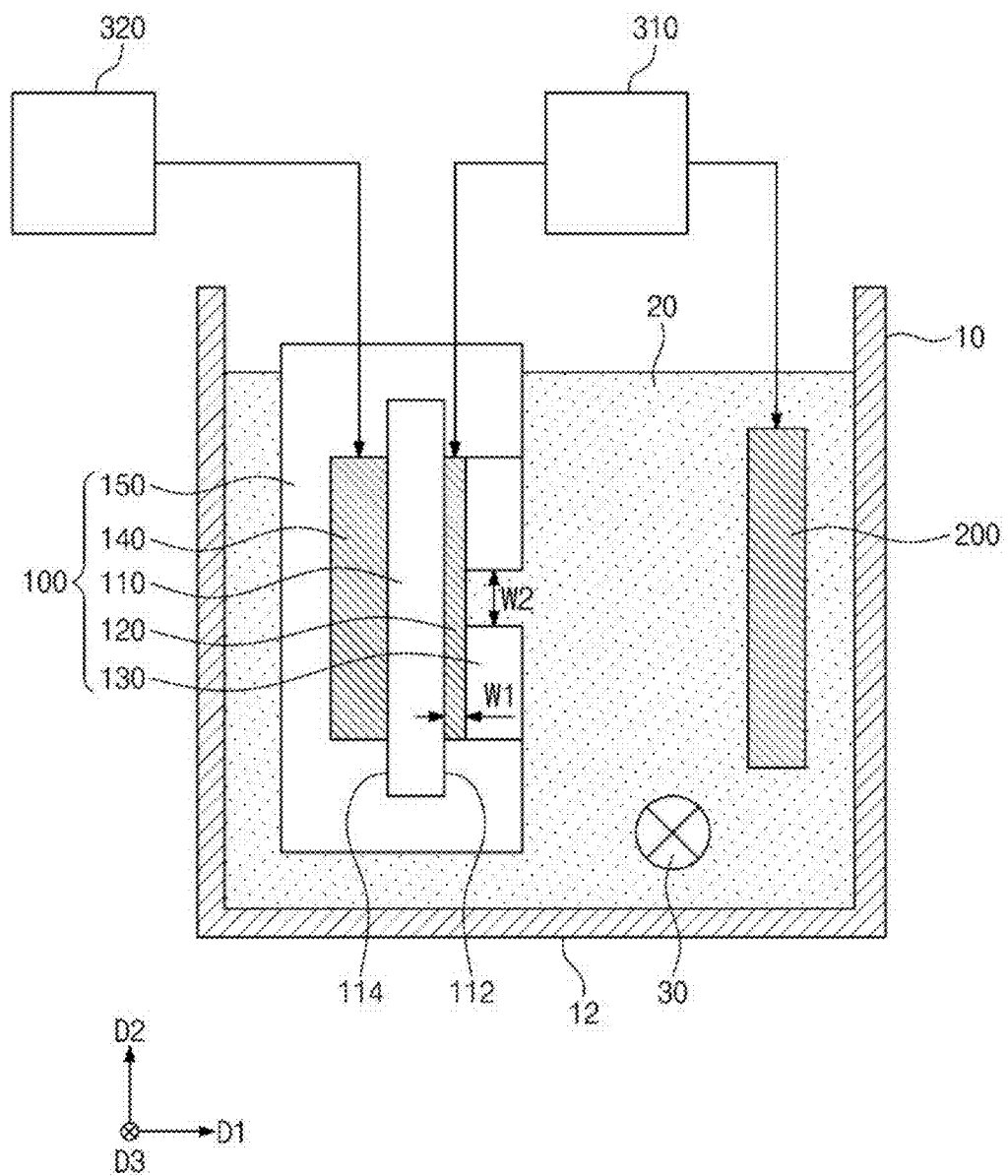
FIG. 1 is a conceptual view illustrating an electroplating apparatus according to exemplary embodiments of the inventive concepts.

Hereinafter, preferred embodiments of the inventive concept will be explained in detail with reference to the accompanying drawings for the sufficient understanding of the configuration and effects of the inventive concept. The inventive concept may, however, be embodied in different forms and should not be construed as limited to the embodiments set forth herein. Rather, these embodiments are provided so that this disclosure will be thorough and complete, and will fully convey the scope of the inventive concept to those skilled in the art.

Like reference numerals refer to like elements throughout the embodiments herein. The embodiment herein will be described with conceptual views, sectional views and/or plan views as ideal exemplary views of the present invention. In the figures, the dimensions of layers and regions are exaggerated for an effective description of technical content. Areas exemplified in the drawings have general properties, and are used to illustrate a specific shape of a device region. The embodiments of the present invention are not limited to the specific shape illustrated in the exemplary views, but may include other shapes that may be created according to manufacturing processes.

Unless otherwise defined, all terms used herein have the same meaning as commonly understood by one of ordinary skill in the art to which this inventive concept belongs. In the following description, the technical terms are used only for explaining a specific exemplary embodiment while not limiting the present invention. The terms of a singular form may include plural forms unless referred to the contrary. The meaning of "include," "comprise," "including," or "comprising," specifies mentioned components, steps, operations and/or elements but does not exclude other components, steps, operations and/or elements.

Hereinafter, exemplary embodiments of the inventive concept will be described in detail with reference to the accompanying drawings.

Figure 2:
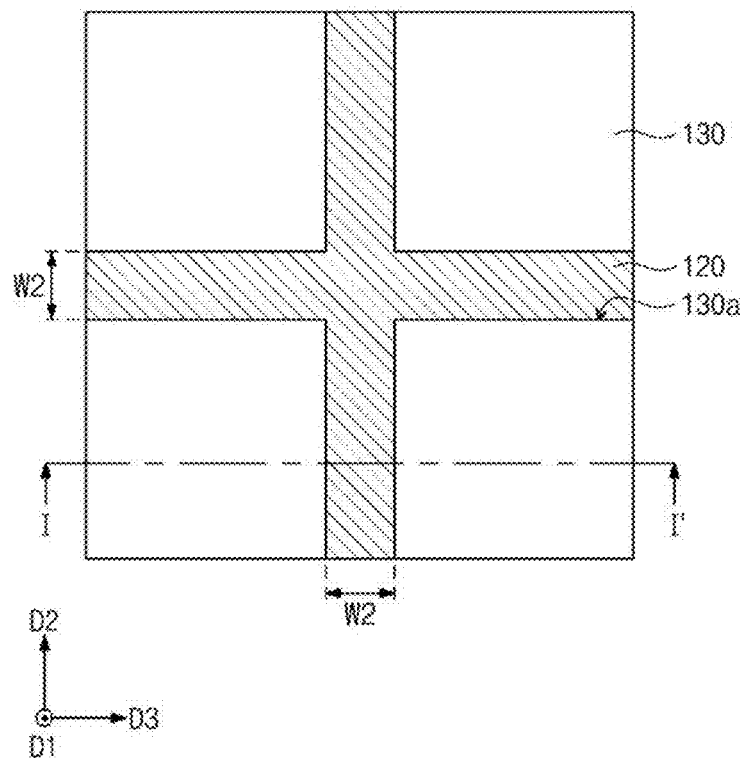
FIG. 2 is a plan view of a portion of a cathode structure of FIG. 1.
Figure 3:
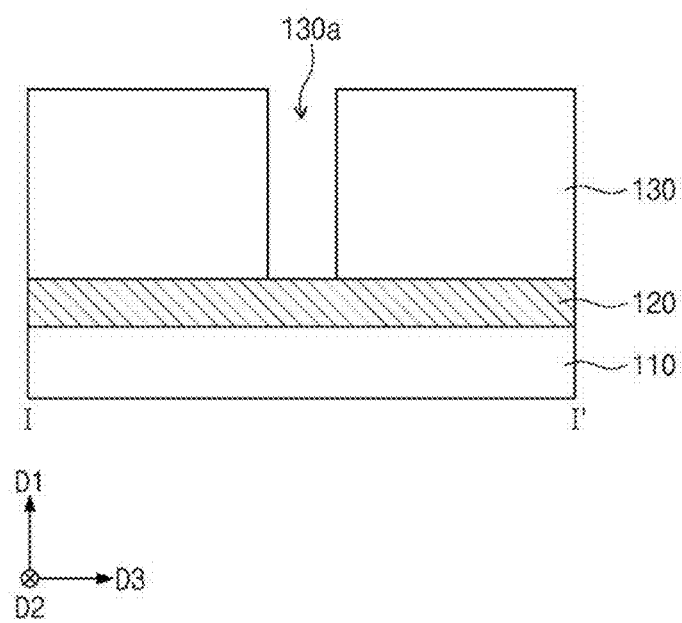
FIG. 3 is a cross-sectional view of a portion of a cathode structure, taken along line I-I' of FIG. 2.

FIG. 1 is a conceptual view illustrating an electroplating apparatus according to exemplary embodiments of the inventive concepts. FIG. 2 is a plan view of a portion of a cathode structure of FIG. 1. FIG. 3 is a cross-sectional view of a portion of a cathode structure, taken along line I-I' of FIG. 2.

Referring to FIGS. 1 to 3, a vessel 10, which is used to perform an electroplating process, may be provided. A shape of the vessel 10 may be illustrated as an example and not limited thereto.

An electrolyte 20 may be provided in the vessel 10. The vessel 10 may be filled with the electrolyte 20. The electrolyte 20 may include a metal-containing aqueous solution, and in some embodiments, such a metal may be selected to form at least a portion of an anode structure to be described later. For example, the electrolyte 20 may include an aqueous solution of copper sulfate. A circulator 30 may be provided in the electrolyte 20. The circulator 30 may be used to circulate the electrolyte 20.

A cathode structure 100 may be provided in the vessel 10. The cathode structure 100 may include a substrate 110, a seed layer 120, and a capping pattern 130. The seed layer 120 and the capping pattern 130 may be sequentially stacked on the substrate 110. The cathode structure 100 may further include a high-voltage portion 140, which is spaced apart from the seed layer 120 with the substrate 110 interposed therebetween, and a housing 150, which is provided to cover the high-voltage portion 140. In exemplary embodiments, the substrate 110 may be disposed substantially perpendicular to a bottom surface 12 of the vessel 10. For example, the substrate 110 may be provided in such a way that its extension direction is perpendicular to the bottom surface 12 of the vessel 10. The substrate 110 may extend lengthwise along a direction perpendicular to the bottom surface 12 of the vessel 10. The substrate 110 may have a top surface 112 and a bottom surface 114, which are substantially perpendicular to the bottom surface 12 of the vessel 10 and are parallel to each other. The substrate 110 may include insulating materials. For example, the substrate 110 may include glass, plastic, or combinations thereof. The substrate 110 may be transparent.

The seed layer 120 may be provided on the top surface 112 of the substrate 110. The seed layer 120 may be used as a seed for an electroplating process. A plating material may be provided on the seed layer 120 by the electroplating process. In exemplary embodiments, the seed layer 120 may be provided to be substantially perpendicular to the bottom surface 12 of the vessel 10. For example, the seed layer 120 may be provided in such a way that its extension direction is perpendicular to the bottom surface 12 of the vessel 10. The seed layer 120 may extend lengthwise along the direction perpendicular to the bottom surface 12 of the vessel 10. The seed layer 120 may have a bottom surface facing the substrate 110, a top surface, which is opposite and parallel to the bottom surface, and side surfaces connecting the top and bottom surfaces to each other. The seed layer 120 may be dipped in the electrolyte 20. A thickness W1 of the seed layer 120 may, for example, be less than 20 nm, when measured in a first direction D1 perpendicular to the top surface 112 of the substrate 110. The seed layer 120 may include conductive materials. For example, the seed layer 120 may include aluminum (Al), molybdenum (Mo), gold (Au), palladium (Pd), titanium (Ti), an alloy of silver (Ag) including copper (Cu), silver (Ag), or combinations thereof.

The capping pattern 130 may be provided on the seed layer 120. The capping pattern 130 may include an opening 130a penetrating therethrough, and the opening 130a may define a position and shape of an electroplating layer to be formed by the electroplating process. For example, a portion of the top surface of the seed layer 120 may be exposed by the opening 130a of the capping pattern 130, and the remaining portion of the top surface of the seed layer 120 may be covered by the capping pattern 130. The electroplating layer may be provided on the exposed portion of the top surface of the seed layer 120 and may not be provided on the remaining portion of the top surface of the seed layer 120. The capping pattern 130 A mat have a bottom surface facing the seed layer 120, a top surface, which is opposite to and parallel to the bottom surface, and side surfaces connecting the top and bottom surfaces to each other. In exemplary embodiments, a minimum distance W2 between inner side surfaces of the opening 130a, in a direction parallel to the top surface 112 of the substrate 110, may range from about 1 µm to about 20 µm. In other words, the minimum width of the exposed portion of the top surface of the seed layer 120 may range from about 1 µm to about 20 µm. A thickness of the capping pattern 130 in the first direction D1 may, for example, range from about 40 nm to about 50 nm.

In exemplary embodiments, the capping pattern 130 may include photoresist materials. When the capping pattern 130 includes photoresist materials, the capping pattern 130 may be removed after the formation of an electroplating pattern (e.g., the electroplating layer). Thus, the electroplating pattern may remain on the top surface of the seed layer 120 without the capping pattern 130.

In other exemplary embodiments, the capping pattern 130 may include oxide, nitride, or combinations thereof. For example, the capping pattern 130 may include zinc oxide, tin oxide, silicon oxide, titanium oxide, silicon nitride, ZITO (zinc-indium-tin oxide), ZTO (zinc-tin-oxide), AZO (Al-doped ZnO), GZO (Ga-doped ZnO), ITO (indium-tin-oxide), IZO (indium-zinc-oxide), or combinations thereof. When the capping pattern 130 includes oxide, nitride, or combinations thereof, the capping pattern 130 may still remain after the formation of the electroplating pattern.

The high-voltage portion 140 may be provided on the bottom surface 114 of the substrate 110. The high-voltage portion 140 may have a flat plate shape and may be parallel to the seed layer 120. The high-voltage portion 140 and the seed layer 120 may be spaced apart from each other in the first direction D1 with the substrate 110 interposed therebetween. The high-voltage portion 140 may have a top surface facing the substrate 110, a bottom surface parallel to the top surface, and side surfaces connecting the top and bottom surfaces to each other. The seed layer 120 may overlap with the high-voltage portion 140, when viewed in a plan view parallel to the top surface of the substrate 110. For example, an area of the top surface of the high-voltage portion 140, which is immediately adjacent to the substrate 110, may be the same as or less than an area of the bottom surface of the seed layer 120, which is immediately adjacent to the substrate 110. The high-voltage portion 140 may be electrically separated or isolated from the seed layer 120. In exemplary embodiments, the high-voltage portion 140 may include metal materials.

The housing 150 may be provided on the high-voltage portion 140. The housing 150 may be provided to seal the high-voltage portion 140. For example, the housing 150 may be provided to wholly cover the high-voltage portion 140, except for a portion of the high-voltage portion 140 in contact with the bottom surface 114 of the substrate 110. In some embodiments, the housing 150 may cover the bottom and side surfaces of the high-voltage portion 140. The housing 150 may also be provided to hermetically seal or surround the substrate 110. For example, the housing 150 may be provided to wholly cover the substrate 110, except for portions of the substrate 110 in contact with the high-voltage portion 140 and the seed layer 120. The housing 150 may be provided to cover the side surfaces of the seed layer 120. The housing 150 may expose the top surface of the seed layer 120. The housing 150 may be provided to cover the side surfaces of the capping pattern 130. The housing 150 may be provided to expose the top surface of the capping pattern 130 and the inner side surfaces of the opening 130a. The housing 150 may include insulating materials. The high-voltage portion 140 may be spaced apart from the seed layer 120 and the electrolyte 20 by the housing 150 and the substrate 110. The high-voltage portion 140 may be electrically separated or isolated from the seed layer 120 and the electrolyte 20 by the housing 150 and the substrate 110.

An anode structure 200 may be provided in the vessel 10. The anode structure 200 may be spaced apart from the cathode structure 100. For example, the anode structure 200 may be spaced apart from the seed layer 200 in the first direction D1 perpendicular to the top surface 112 of the substrate 110. The anode structure 200 may be dipped in the electrolyte 20. The anode structure 200 may have a flat plate shape. In exemplary embodiments, the anode structure 200 may be disposed substantially perpendicular to the bottom surface 12 of the vessel 10. For example, the anode structure 200 may be provided in such a way that its extension direction is perpendicular to the bottom surface 12 of the vessel 10. The anode structure 200 may extend lengthwise along the direction perpendicular to the bottom surface 12 of the vessel 10. The anode structure 200 may have a top surface, which faces the cathode structure 100, and a bottom surface, which is parallel and opposite to the top surface of the anode structure 200. The anode structure 200 may be disposed to be substantially parallel to the seed layer 120. For example, the top surface of the anode structure 200 may be substantially parallel to the top surface of the seed layer 120. In some embodiments, the top and bottom surfaces of the anode structure 200 may be substantially parallel to the top surface of the seed layer 120. The anode structure 200 may include at least one of metal elements. For example, the anode structure 200 may include gold (Au), silver (Ag), copper (Cu), indium (In), nickel (Ni), or combinations thereof.

A first power source 310 may be provided to produce a difference in voltage between the seed layer 120 and the anode structure 200 (hereinafter, 'first voltage difference'). The first power source 310 may be a direct current (DC) power source. A positive terminal of the first power source 310 may be electrically connected to the anode structure 200, and a negative terminal of the first power source 310 may be electrically connected to the seed layer 120. Thus, an electric potential of the anode structure 200 may be higher than that of the seed layer 120.

A second power source 320 may be provided to apply a second voltage to the high-voltage portion 140. For example, the second power source 320 may be configured to apply the second voltage, which ranges from about 1 kV to about 100 kV, to the high-voltage portion 140.

Figure 4:
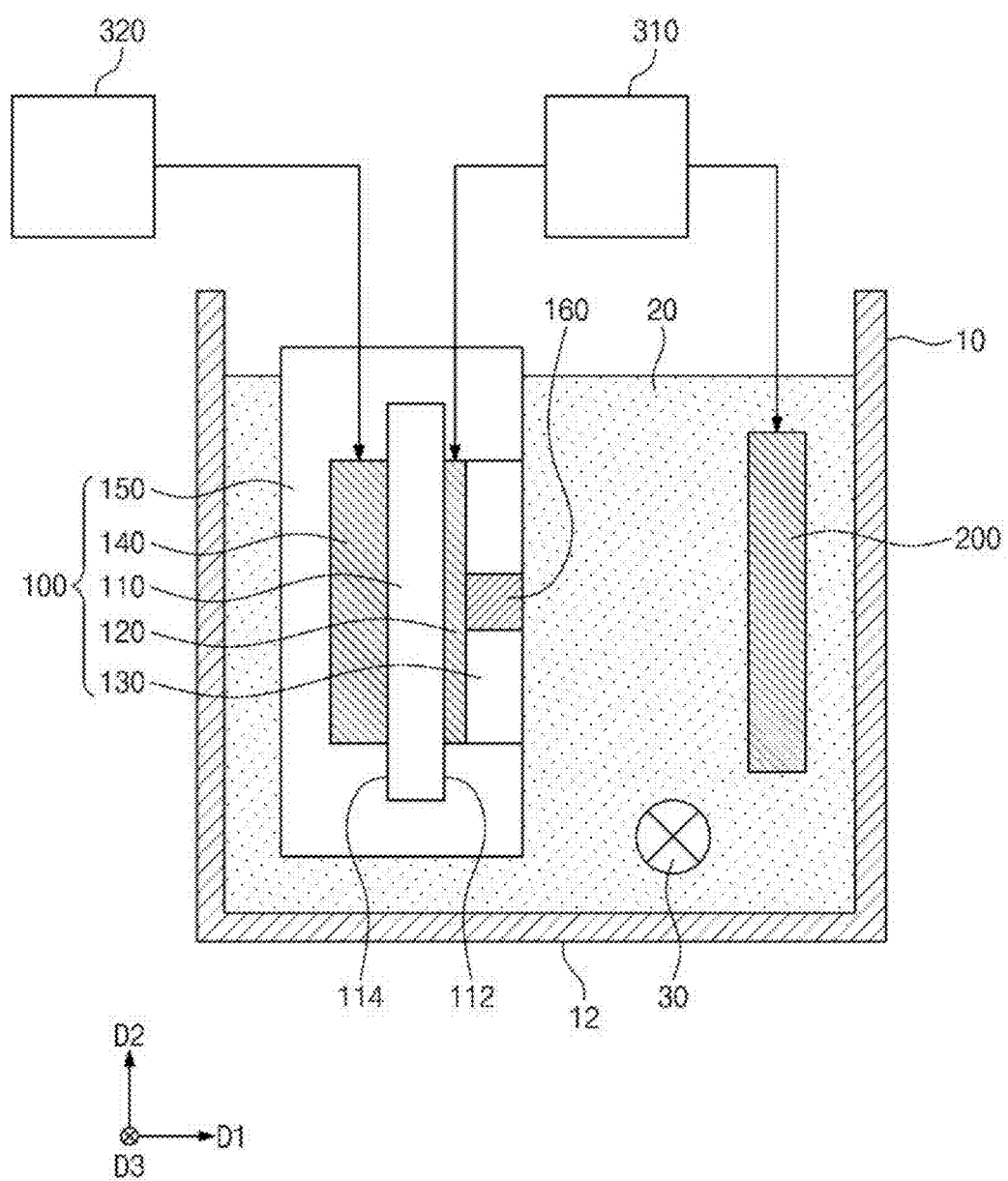
FIG. 4 is a conceptual view illustrating an electroplating apparatus, which is configured to perform an electroplating method according to exemplary embodiments of the inventive concepts.

FIG. 4 is a conceptual view illustrating an electroplating apparatus, which is configured to perform an electroplating method according to exemplary embodiments of the inventive concepts. For concise description, an element previously described with reference to FIGS. 1 to 3 may be identified by a similar or identical reference number without repeating an overlapping description thereof.

Referring to FIG. 4, an electroplating apparatus may be prepared. The electroplating apparatus may be configured to have substantially the same features as those of FIGS. 1 to 3. The electrolyte 20 may include an aqueous solution of copper sulfate. The anode structure 200 may include copper (Cu), and the seed layer 120 may include silver (Ag). A positive terminal of the first power source 310 may be electrically connected to the anode structure 200, and a negative terminal of the first power source 310 may be electrically connected to the seed layer 120. The high-voltage portion 140 may be supplied with the second voltage (e.g., of about 1 kV-100 kV) from the second power source 320. The circulator 30 may be configured to circulate the electrolyte 20 in the vessel 10.

Copper atoms in the anode structure 200 may lose electrons to form copper ions, which will be supplied into the electrolyte 20. The electrons may migrate to the seed layer 120. The electrons may be supplied to the copper ions on an exposed top surface of the seed layer 120 through the opening 130a of the capping pattern 130. Thus, an electroplating layer 160 may be formed on the exposed top surface of the seed layer 120. The electroplating layer 160 may include copper (Cu). A thickness of the electroplating layer 160 may range from about 2 μm to about 3 when measured in the direction perpendicular to the top surface 112 of the substrate 110 (i.e. in the first direction D1). An amount of metal material, which is required for a metal pattern (e.g., the electroplating layer 160), may be less in an electroplating process than in a patterning process. Thus, by using the electroplating process according to exemplary embodiments of the inventive concepts, it may be possible to reduce cost for the formation of the metal pattern (e.g., the electroplating layer 160).

Generally, the seed layer 120 may have a non-uniform electron concentration. For example, the electron concentration in an edge portion of the seed layer 120 may be higher than that in a center portion of the seed layer 120. The edge and center portions of the seed layer 120 may be regions defined in a plan view. In this case, the electroplating layer 160 may be formed to have a non-uniform thickness on the top surface of the seed layer 120. For example, a thickness of the electroplating layer 160 may be thicker on a portion of the seed layer 120 with a relatively high electron concentration than on other portions of the seed layer 120 with a relatively low electron concentration. In other words, the thickness of the electroplating layer 160 on the edge portion of the seed layer 120 may be thicker than that on the center portion of the seed layer 120. For example, the electroplating layer 160 may be selectively formed on the portion of the seed layer 120 (e.g., having the relatively high electron concentration). In other words, there may be a difficulty in forming the electroplating layer 160 on the entire seed layer 120 (i.e., including a portion whose electron concentration is relatively low).

According to exemplary embodiments of the inventive concepts, the high-voltage portion 140 may be configured to allow the seed layer 120 to have a uniform electron concentration. For example, the electron concentration in the edge portion of the seed layer 120 may be substantially the same as that in the center portion of the seed layer 120. This may make it possible to uniformly form the electroplating layer 160 on the top surface of the seed layer 120. For example, the electroplating layer 160 may be formed on the exposed top surface of the seed layer 120 with substantially the same thickness. The thickness of the electroplating layer 160 may be uniform, when measured in the first direction D1. Hereinafter, a structure including the substrate 110, the seed layer 120, and the electroplating layer 160 will be referred to a transparent electrode. The transparent electrode may be, for example, used as a part of a touch panel or a transparent heater.

The electroplating layer 160 may have a mesh shape (not shown). For example, in a plan view, the electroplating layer 160 may include first metal lines, which extend in a second direction D2 and are arranged in a third direction D3 crossing the second direction D2, and second metal lines, which extend in the third direction D3 and are arranged in the second direction D2. The second direction D2 and the third direction D3 may be parallel to the top surface 112 of the substrate 110. The first metal lines and the second metal lines may cross to each other, thereby forming the mesh shape. Each of the first and second metal lines may have a minimum width in a direction parallel to the top surface 112 of the substrate 110 (e.g., the second or third direction D2 or D3). For example, the minimum width of each of the first and second metal lines may range from about 1 μm to about 20 μm. A thickness of each of the first and second metal lines, in the first direction D1, may range from about 2 μm to about 3 Thus, when the transparent electrode (e.g., larger than 100 inch) includes the electroplating layer 160 according to exemplary embodiments of the inventive concepts, the transparent electrode may have sheet resistance of 1 Ω/sq or lower.

Figure 5:
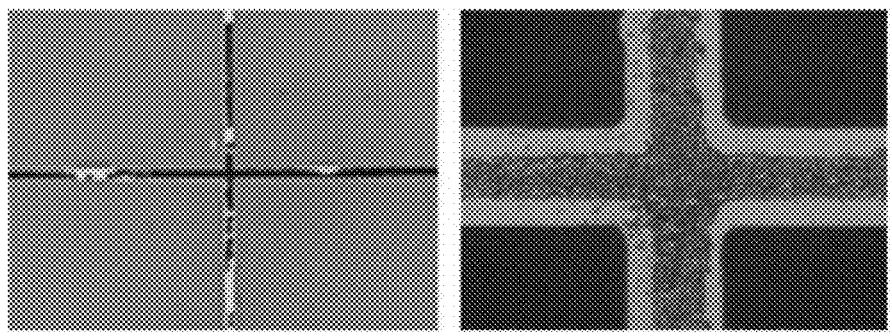
FIG. 5 is an image of an electroplating layer formed by a conventional electroplating method.
Figure 6:
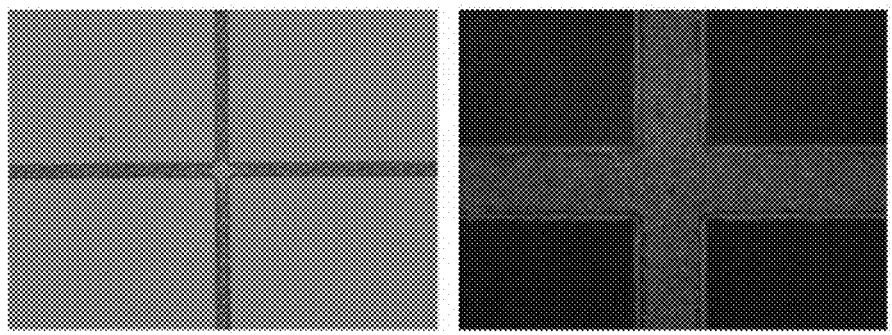
FIG. 6 is an image of an electroplating layer formed by an electroplating method according to exemplary embodiments of the inventive concepts.
Figure 7:
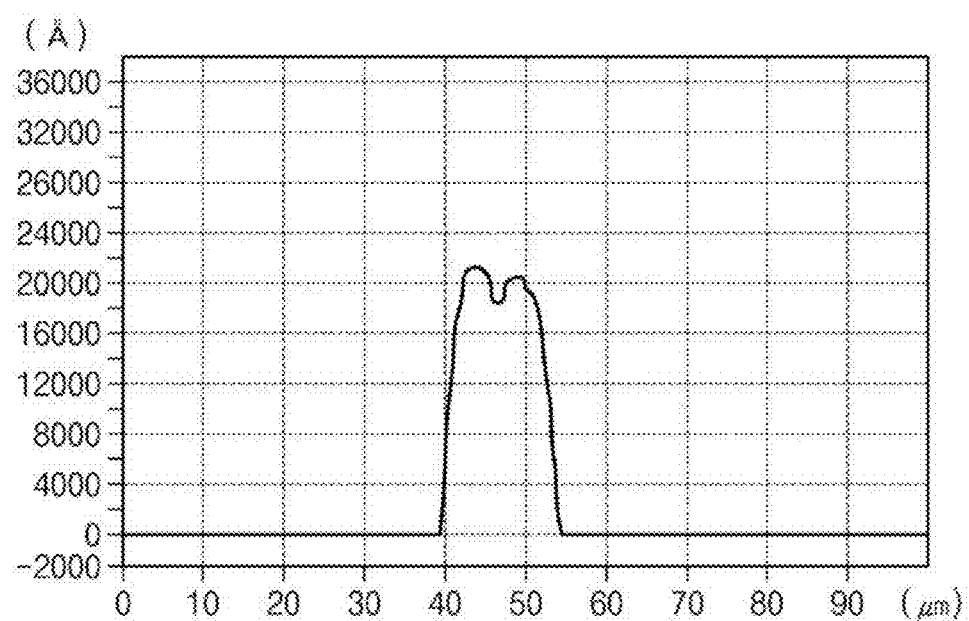
FIG. 7 is a graph illustrating a thickness of an electroplating layer of FIG. 6.

FIG. 5 is an image of an electroplating layer formed by a conventional electroplating method. FIG. 6 is an image of an electroplating layer formed by an electroplating method according to exemplary embodiments of the inventive concepts. FIG. 7 is a graph illustrating a thickness and a width of an electroplating layer of FIG. 6.

Referring to FIG. 5, an electroplating layer was formed to cover partially but not completely a top surface of a portion of the seed layer, which is exposed by the opening of the capping pattern. In other words, the electroplating layer was unevenly formed.

Referring to FIG. 6, an electroplating layer was evenly formed on a top surface of a portion of the seed layer, which is exposed by the opening of the capping pattern.

Referring to FIG. 7, the electroplating layer of FIG. 6 was substantially evenly formed to have a width of about 15 μm and a thickness of about 2 μm.

Figure 8:
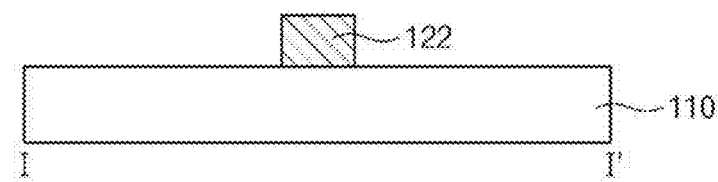
FIG. 8 is a cross-sectional view of a portion of a cathode structure, corresponding to line I-I' of FIG. 2, according to some embodiments of the inventive concepts.
Figure 8:
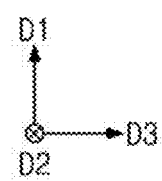

FIG. 8 is a cross-sectional view of a portion of a cathode structure, corresponding to line I-I' of FIG. 2, according to some embodiments of the inventive concepts. For concise description, an element previously described with reference to FIGS. 1 to 3 may be identified by a similar or identical reference number without repeating an overlapping description thereof.

Referring to FIG. 8, a substrate 110 may be provided. The substrate 110 may be configured to have substantially the same features as that described with reference to FIGS. 1 to 3.

A seed pattern 122 may be provided on the substrate 110. In a plan view, a shape of the seed pattern 122 may be substantially the same as that of an exposed portion of the seed layer 120, which is exposed by the opening 130a of the capping pattern 130 described with reference to FIGS. 1 to 3. A thickness of the seed pattern 122 in the first direction D1 may be about 20 nm or less. The seed pattern 122 may have a minimum width in the second direction D2 (or the third direction D3). For example, the minimum width of the seed pattern 122 in the second direction D2 may range from about 1 μm to about 20 In certain embodiments, unlike that shown in FIGS. 1 to 3, the capping pattern 130 may not be provided. Thus, the top surface of the substrate 110 may be exposed at both sides of the seed pattern 122. In the case that the electroplating process is performed using the cathode structure according to the present embodiments, the electroplating layer (not shown) may be formed on top and side surfaces of the seed pattern 122.

Although not shown, a photoresist pattern may be formed on the exposed portion of the substrate 110 at both sides of the seed pattern 122. The photoresist pattern may be removed from the substrate 110, after the electroplating process. Thus, the seed pattern 122 and the electroplating layer may remain on the substrate 110 and be stacked sequentially on the substrate 110.

Figure 9:
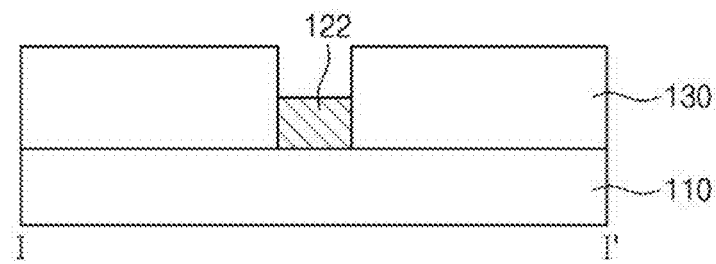
FIG. 9 is a cross-sectional view of a portion of a cathode structure, corresponding to line I-I' of FIG. 2, according to some embodiments of the inventive concepts.
Figure 9:
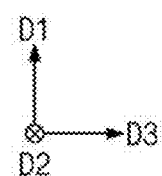

FIG. 9 is a cross-sectional view of a portion of a cathode structure, corresponding to line I-I' of FIG. 2, according to some embodiments of the inventive concepts. For concise description, an element previously described with reference to FIGS. 1 to 3 and 8 may be identified by a similar or identical reference number without repeating an overlapping description thereof.

Referring to FIG. 9, a seed pattern 122 may be provided on a substrate 110. The substrate 110 may be configured to have substantially the same features as that described with reference to FIGS. 1 to 3. The seed pattern 122 may be configured to have substantially the same features as that described with reference to FIG. 8.

A capping pattern 130 may be provided on the substrate 110. The capping pattern 130 may cover an exposed portion of the substrate 110, which is exposed at both sides of the seed pattern 122, and side surfaces of the seed pattern 122. A thickness of the capping pattern 130 may be thicker than that of the seed pattern 122, when measured in the first direction D1. For example, the thickness of the capping pattern 130 may range about 40 nm to about 50 nm. The capping pattern 130 may expose a top surface of the seed pattern 122. The capping pattern 130 may include oxide, nitride, or combinations thereof. For example, the capping pattern 130 may include zinc oxide, tin oxide, silicon oxide, titanium oxide, silicon nitride, ZITO (zinc-indium-tin oxide), ZTO (zinc-tin-oxide), AZO (Al-doped ZnO), GZO (Ga-doped ZnO), ITO (indium-tin-oxide), IZO (indium-zinc-oxide), or combinations thereof. In the case that the electroplating process is performed using the cathode structure according to the present embodiments, the electroplating layer (not shown) may be formed on the top surface of the seed pattern 122, which is exposed by the capping pattern 130. In a plan view, the electroplating layer may have substantially the same shape as that of the seed pattern 122, and thus, the minimum width of the electroplating layer may range from about 1 μm to about 20 μm, when measured in the second or third direction D2 or D3.

Although not shown, a photoresist pattern may be provided on the capping pattern 130. After the electroplating process, the photoresist pattern may be removed from the capping pattern 130. Thus, the seed pattern 122, the electroplating layer on the seed pattern 122, and the capping pattern 130 on side surfaces of each of the seed pattern 122 and the electroplating layer may remain on the substrate 110.

Figure 10:
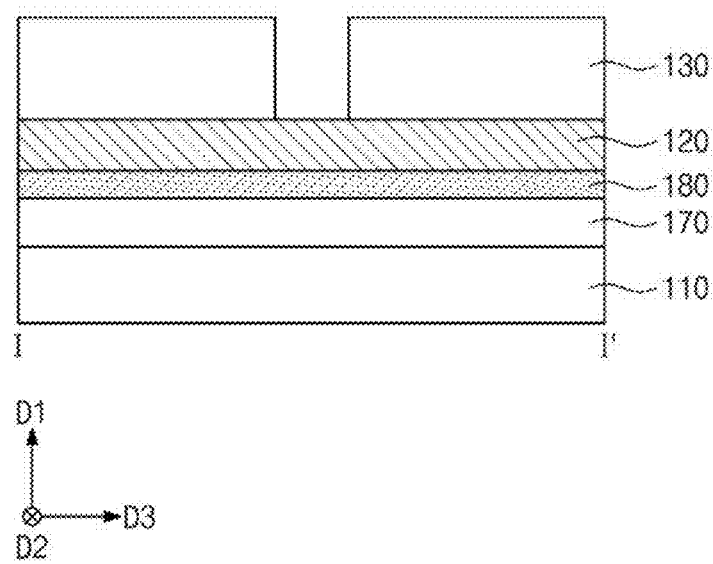
FIG. 10 is a cross-sectional view of a portion of a cathode structure, corresponding to line I-I' of FIG. 2, according to some embodiments of the inventive concepts.

FIG. 10 is a cross-sectional view of a portion of a cathode structure, corresponding to line I-I' of FIG. 2, according to some embodiments of the inventive concepts. For concise description, an element previously described with reference to FIG. 9 may be identified by a similar or identical reference number without repeating an overlapping description thereof.

Referring to FIG. 10, a seed layer 120 may be provided on a substrate 110, and a capping pattern 130 may be provided on the seed layer 120. The substrate 110 and the seed layer 120 may be configured to have substantially the same features as those described with reference to FIGS. 1 to 3. The capping pattern 130 may be configured to have substantially the same features as that described with reference to FIGS. 1 to 3, for example, it may include oxides, nitrides, or combinations thereof.

A protective layer 170 may be provided between the substrate 110 and the seed layer 120. A thickness of the protective layer 170 in the first direction D1 may range from about 40 nm to about 50 nm. The protective layer 170 may include oxide, nitride, or combinations thereof. For example, the protective layer 170 may include zinc oxide, tin oxide, silicon oxide, titanium oxide, silicon nitride, ZITO (zinc-indium-tin oxide), ZTO (zinc-tin-oxide), AZO (Al-doped ZnO), GZO (Ga-doped ZnO), ITO (indium-tin-oxide), IZO (indium-zinc-oxide), or combinations thereof.

An adhesive layer 180 may be provided between the protective layer 170 and the seed layer 120. The adhesive layer 180 may be used to fasten the seed layer 120 to the protective layer 170. The adhesive layer 180 may be transparent. In exemplary embodiments, the adhesive layer 180 may include aluminum (Al), titanium (Ti), chrome (Cr), aluminum nitride (AlN), titanium nitride (TiN), aluminum oxide ($Al_2O_3$), titanium oxide ($TiO_2$), chrome oxide ($Cr_2O_3$), or combinations thereof.

According to exemplary embodiments of the inventive concepts, the electroplating apparatus may include the high-voltage portion. Generally, the seed layer 120 may have a non-uniform electron concentration. In this case, the electroplating layer 160 may be formed to have a non-uniform thickness on the seed layer. The high-voltage portion 140 may be configured to allow the seed layer 120 to have a uniform electron concentration. Thus, the electroplating layer may be formed to have a uniform thickness on the seed layer (or the seed pattern). The efficiency according to exemplary embodiments of the inventive concepts may not be limited to the above disclosure.

Although the exemplary embodiments of the present invention have been described, it is understood that the present invention should not be limited to these exemplary embodiments but various changes and modifications can be made by one ordinary skilled in the art within the spirit and scope of the present invention as hereinafter claimed.

What is claimed is:
1. An electroplating apparatus comprising:
a housing including an insulating material;
a high-voltage portion provided in the housing;
an anode structure spaced apart from the housing;
a first power source generating a first voltage to the anode structure; and
a second power source configured to apply a second voltage from 1 kV to 100 kV to the high-voltage portion,
wherein the housing exposes a top surface of the high-voltage portion,
wherein the first power source and the second power source are spaced apart from each other,
wherein the anode structure is electrically separated from the high-voltage portion, and
wherein the high-voltage portion provides a uniform electron concentration to a material that is plated.
2. The apparatus of claim 1, wherein the housing is provided to cover bottom and side surfaces of the high-voltage portion.
3. The apparatus of claim 1, further comprising:
a vessel for electroplating; and
an electrolyte provided in the vessel,
wherein the housing, the high-voltage portion and the anode structure are dipped in the electrolyte.
4. The apparatus of claim 3, further comprising a circulator provided in the vessel to circulate the electrolyte.
5. The apparatus of claim 3, wherein the anode structure is a plate-shaped structure extending lengthwise along a direction perpendicular to a bottom surface of the vessel.
6. The apparatus of claim 3, wherein the high-voltage portion is electrically separated from the electrolyte.
7. An electroplating apparatus comprising:
a housing including an insulating material;
a high-voltage portion provided in the housing;
an anode structure spaced apart from the housing;

a first power source generating a first voltage to the anode structure;
a second power source configured to apply a second voltage from 1 kV to 100 kV to the high-voltage portion,
a vessel for electroplating; and
an electrolyte provided in the vessel,
wherein the housing exposes a top surface of the high-voltage portion,
wherein the first power source and the second power source are spaced apart from each other,
wherein the anode structure is electrically separated from the high-voltage portion,
wherein the housing, the high-voltage portion and the anode structure are dipped in the electrolyte, and
wherein the high-voltage portion is electrically separated from the electrolyte.

* * * * *